(12) United States Patent
Lin (10) Patent No.: US 7,408,253 B2
(45) Date of Patent: Aug. 5, 2008

(54) CHIP-EMBEDDED SUPPORT-FRAME BOARD WRAPPED BY FOLDED FLEXIBLE CIRCUIT FOR MULTIPLYING PACKING DENSITY

(76) Inventor: Paul T. Lin, 5125 Tennington Park, Dallas, TX (US) 75287-5440

( * ) Notice: Subject to any disclaimer, the term of this patent is extended or adjusted under 35 U.S.C. 154(b) by 243 days.

(21) Appl. No.: 11/094,111

(22) Filed: Mar. 30, 2005

(65) Prior Publication Data
US 2006/0228830 A1    Oct. 12, 2006

(51) Int. Cl.
*H01L 23/02* (2006.01)
(52) U.S. Cl. .............................. 257/686; 257/E23.177; 257/E23.065; 361/749; 361/755; 174/254
(58) Field of Classification Search .................. 257/686
See application file for complete search history.

(56) References Cited

U.S. PATENT DOCUMENTS

| | | | | |
|---|---|---|---|---|
| 6,121,676 A * | 9/2000 | Solberg | ....................... | 257/686 |
| 6,225,688 B1 * | 5/2001 | Kim et al. | .................... | 257/686 |
| 6,469,377 B1 * | 10/2002 | Kondo | ........................ | 257/686 |
| 6,469,903 B1 * | 10/2002 | Kondo | ........................ | 361/749 |
| 6,677,670 B2 * | 1/2004 | Kondo | ........................ | 257/686 |
| 6,908,792 B2 * | 6/2005 | Bruce et al. | ................. | 438/110 |
| 7,071,547 B2 * | 7/2006 | Kang et al. | .................. | 257/686 |
| 2001/0040793 A1 * | 11/2001 | Inaba | ........................ | 361/749 |
| 2004/0099938 A1 * | 5/2004 | Kang et al. | ................. | 257/686 |
| 2007/0230154 A1 * | 10/2007 | Nakayama | .................. | 361/810 |

* cited by examiner

*Primary Examiner*—Jerome Jackson
*Assistant Examiner*—Jose R Diaz
(74) *Attorney, Agent, or Firm*—Bo-In Lin

(57) ABSTRACT

The present invention includes a chip-embedded support-frame wrapped-by-flex-circuit package assembly. The package assembly includes a flex circuit having a plurality of patterned connecting-traces. The package assembly further includes a plurality of semiconductor chips mounted on the flex circuits wherein the semiconductor chips having a plurality of contact terminals connected to corresponding connecting traces on the flex circuit. The package assembly further includes a support frame-board having an edge surface placed along predefined folded lines on the flex circuit. The frame-board has a plurality of open spaces for disposing each of the semiconductor chips therein. The flex circuit is provided for folding onto the support frame along the predefined folded lines to form the chip-embedded support-frame wrapped-by-flex-circuit package.

6 Claims, 6 Drawing Sheets

Cross Section of Folded and Stacked DIMM

Fig.1A Top view of supporting frame with cavities and edge connectors

Fig. 1B Cross section of Fig.1A

Fig. 1C Direct Chip Attach (DCA) or packaged chip mounted on Flex circuit.

Fig.1D Cross Section of Folded and Stacked DIMM

Fig. 2 Front Side View of Folded BGA Substrate

Fig. 3 Backside of Substrate with CSP Repaired Sites and Folding Lines for Each Folded Chip Fig. 4 Cross Section View of Folded Few Chip BGA -with optional mechanical capping and potting material as encapsulation

Fig. 5 Off Set Chips Folding to Minimize the Stacking Height

Optional heat spreader cooling fins as encapsulation cap.

CHIP-EMBEDDED SUPPORT-FRAME BOARD WRAPPED BY FOLDED FLEXIBLE CIRCUIT FOR MULTIPLYING PACKING DENSITY

BACKGROUND OF THE INVENTION

1. Field of the Invention

This invention relates generally to the electronic package. More particularly, this invention relates to a novel technique to multiple the packing density of conventional dual in-line memory module (DIMM) package and lowering the manufacture costs while improving the thermal performance of such packages by increasing the heat spreading areas on a chip-embedded support-frame. This same folded flexible connection can further be implemented on multiple chips packaged by a ball grid array (BGA) configuration as well.

2. Description of the Prior Art

The packaging industry is constantly challenged by a great demand to increase the packing density of electronic chips. In the meantime, the packing density is limited by the rate of heat removal generated from operation of electronic components densely packed in a very small space. Use of heat spreader to effectively spreading the heat through heat conductivity over the heat spreader is commonly applied. However, use of heat spreader along does not provide an effective solution to double or even multiple the packing density of the electronic chips in a packaging assembly.

In addition to above difficulties, many chip-set providers would like to have multiple chips assembled as standard package such as ball grid array (BGA) assembly in order to increase the board density with enhanced electrical performance. For example, a graphic accelerator chip is combined with memory chips and configured as side-by-side BGA package. However, there is a product yield difficulty related to a requirement that if either one of these chips fails during the test processes, the entire BGA package is useless and must be discarded. The yield of this BGA package can be improved by using a known good die (KGD) for the graphic accelerator and the memory. However, due to the price of KGD, the cost of such package would become unreasonably high. Furthermore, the side-by-side configuration even results in enhanced performance, can only achieve small improvement in packing density due to the inherent nature of such configuration that these two chips are spread out as a side-by-side chip-array on a same horizontal plane.

Additionally, for many applications, it is often desirable to assemble chips or devices manufactured with different technologies into a single standard package such as ball-grid array (BGA) in order to increase board density and enhance electrical performance. Specific examples of such packages may include a processor chip such as a digital signal processor (DSP), a microprocessor or graphic accelerator chip packaged with memory chips as a single BGA package. For portable electronic applications, it may be desirable to package flash memories with static RAM. Broader applications may include assemble silicon integrated circuits (IC) with micro electronic mechanical system (MEMS) or optical devices in a single package. Devices made with different technologies may compose different materials and mounted on different substrates such as ceramic, glass, polyimide film or printed-circuit-board (PCB). Therefore, these devices and their supporting substrates generally have different operational characteristics and often become difficult for integration particular integration of these devices into a rigid single package. Particularly, current configuration by stacking multiple dices in a single package presents great challenges to provide such an integrate package to accommodate different requirements arising from different operation characteristics.

Furthermore, when multiple chips and devices are mounted on a single supporting substrate as a multiple chip module, the requirement of using only the know-good-die (KGD) becomes a cost issue. However, this issue cannot be easily resolved because a small percentage of failed chips of each kind of different chips or devices may significantly reduce the production yield and make the production cost even more expensive. This difficulty is caused by a very realistic problem that a single failed chip among several chips of the MCM module would force one to discard the entire module. In addition to the issues of production yield, the package density cannot be increased when all the chips are placed on a single horizontal plane.

Kim et al. disclose in U.S. Pat. No. 6,225,688 a stacked microelectronic assembly with a structure that includes a flexible substrate having a plurality of attachment sites, test contacts and conductive terminals. The assembly further includes a wiring layer with leads extending to the attachment sites. The assembly assembles a plurality of microelectronic elements to the attachment sites and electrically interconnecting the microelectronic elements and the leads. The flexible substrate is folded so as to stack at least some of the microelectronic elements in substantially vertical alignment with one another to provide a stacked assembly with the conductive terminals exposed at the bottom end of the stack and the test contacts exposed at the top end of the stack. The assembly may be made using a dam and or a spacer to facilitate the folding process. Two stacked microelectronic assemblies may be stacked together by providing a first stacked assembly with a plurality of connection pads exposed at the top end and providing a second stacked assembly with a plurality of solder balls connected to the terminals at the bottom end. By connecting the solder balls to the connection pads, the first assembly and the second assembly may be stacked as a stacked assembly.

The electronic assembly as disclosed by Kim et al. in U.S. Pat. No. 6,225,688 is however still have the limitations and difficulties that the reliability of the package is adversely affected by the mismatch of the coefficient of thermal expansion (CTE) between flexible substrate and the PBC substrate board. Also the strip form of two directional folding will limit the complexity of interconnections or routings between chips to be low pin count devices such as memory products. For most memory devices, the total number of inputs and outputs are generally below fifty. But if multiple chips involved microprocessors, the total numbers of inputs and outputs will be easily over one hundred or even more. Furthermore, if one of the multiple chips fails the tests, then the entire package has to be repaired and if the failure is beyond repair the entire package has to be discarded. This creates a particular difficulty that when an expensive chip of high pin count is packaged together with peripheral chips, a package included the expensive chip may have to be discarded or great efforts are required to remove the expensive chip from the package if one of the peripheral chips fail the tests.

Therefore, a need still exits in the art to provide an improved configuration and procedure for packaging and testing the multiple chip modules to multiple the packing density without limited by difficulties of low production yield, low packing density and low heat dissipation rate. It is highly desirable to achieve a double or even multiple folds of packing density to increase the package density without being limited by the heat dissipation difficulties. There is a further need to provide edge connector configuration for standard edge insertion of a multiple-chip memory module. Also, it is desirable that for a multiple chip assembly, the difficulty of low percentage of product yield may be resolved without requiring the use of the known-good-die (KGD) for each assembly such that the production cost can be reduced.

SUMMARY OF THE PRESENT INVENTION

It is therefore an object of the present invention to provide an improved packaging configuration to achieve higher packing density while improving the heat removal through heat conductivity such that the aforementioned difficulties and limitations encountered in the prior art can be overcome.

Specifically, it is an object of the present invention to provide a novel packaging configuration by employing chip embedded frame-board wrapped by flex-circuit to achieve improved packing density. Packing density that is double or four times as that provided by convention package configuration can be achieved. The chip embedded frame-board is employed as highly effective heat spreader to conduct and remove the heat. Higher packing density is achieved with improved thermal performance by using the packaging configuration disclosed by this invention.

Another object of this invention is to provide a novel configuration to increase the packing density and in the meantime provide flexibility to repair a chip or to reclaim a chip when packaged with a failed chip.

Briefly, in a preferred embodiment, the present invention discloses a method for assembling an electronic package comprising the steps of: a)patterning a flex circuit to form a plurality of connecting traces; b) mounting a plurality of semiconductor chips or packages onto the flex circuit and interconnecting contact terminals on the chips or packages with corresponding connecting traces; c) placing a supporting frame-board with an edge surface aligned with predefined folding lines on the flex circuit wherein the foldable frame-board having substantially a shape and size as a folded-in-half of the flex circuit and having open spaces for disposing each of the semiconductor chips therein; and d) folding the flex circuit mounted with the semiconductor chips along the predefined folded lines wrapping the supporting framed board with the semiconductor chips disposed in the open spaces whereby a chip-embedded support-frame wrapped-by flex-circuit package is provided to multiple a packing density of the semiconductor chips.

This invention also discloses a chip-embedded support-frame wrapped-by-flex-circuit package assembly. The package assembly includes a flex circuit having a plurality of patterned connecting-traces. The package assembly further includes a plurality of semiconductor chips mounted on the flex circuits wherein the semiconductor chips having a plurality of contact terminals connected to corresponding connecting traces on the flex circuit. The package assembly further includes a support frame-board having an edge surface placed along predefined folded lines on the flex circuit. The frame-board has a plurality of open spaces for disposing each of the semiconductor chips therein. The flex circuit is provided for folding onto the support frame along the predefined folded lines to form the chip-embedded support-frame wrapped-by-flex-circuit package.

These and other objects and advantages of the present invention will no doubt become obvious to those of ordinary skill in the art after having read the following detailed description of the preferred embodiment, which is illustrated in the various drawing figures.

DETAILED DESCRIPTION OF THE PREFERRED EMBODIMENT

Figure 1A:
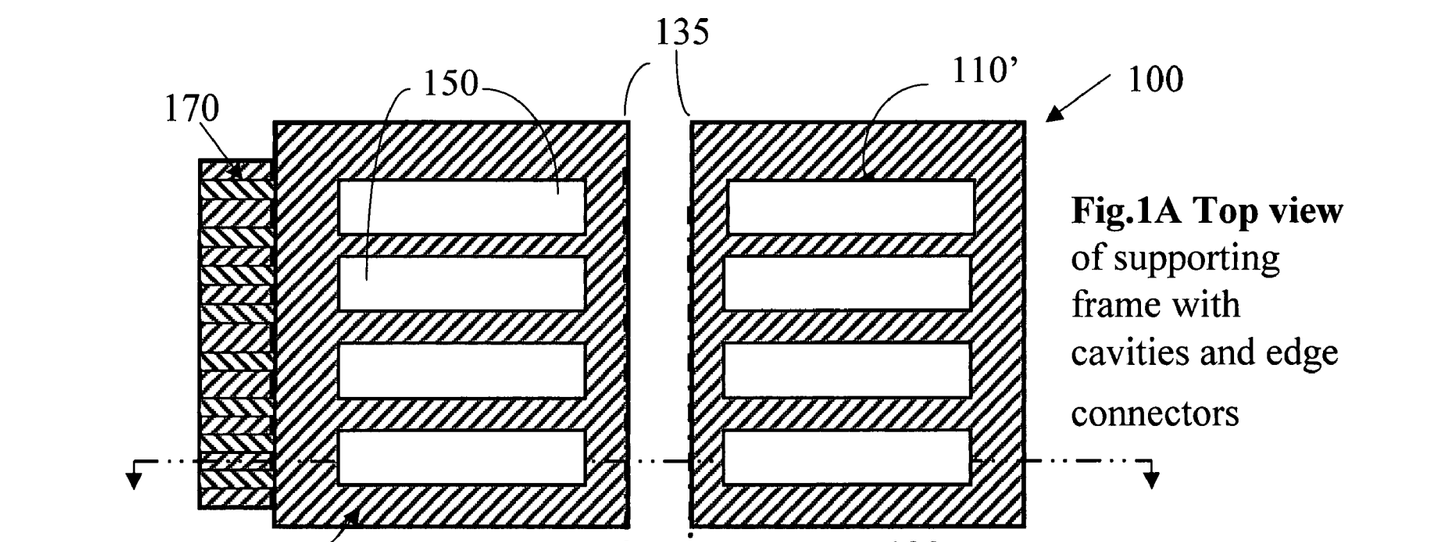
FIG. 1A is a top view and FIGS. 1B and 1C are two alternate cross sectional views of two chip-embedded frame-board wrapped by flex-circuit package-assemblies of the present invention.
Figure 1B:
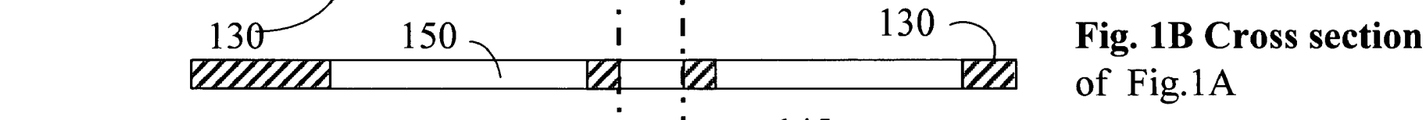
Figure 1C:
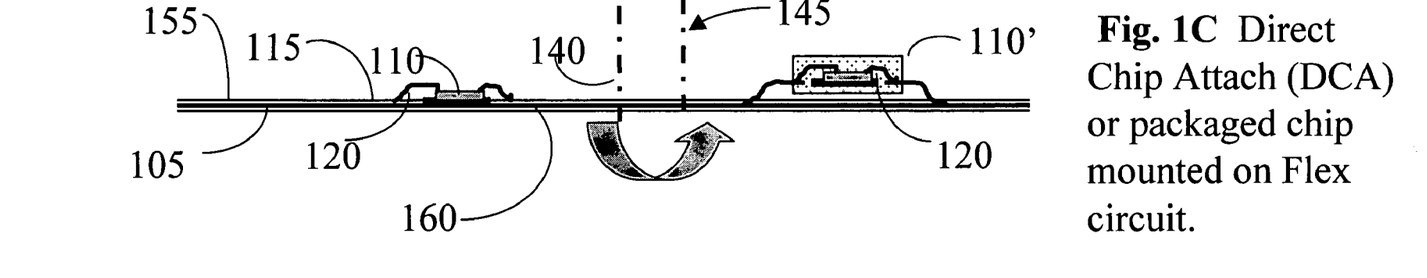

Please refer to FIG. 1A for a top view of a frame-board and FIGS. 1B and 1C for two cross sectional views for showing frame-board with cavities and IC mounted on flexible circuit board. The IC mounted on the flexible circuit board can be bare chips directly attached to the flexible circuit board with wire-bonding interconnections as generally referred to as direct chip attachment (DCA). The IC chip can also be mounted with standard surface mounted (SMT) packages as that shown in two alternate flex-circuit package-assemblies 110 and 110'. Each of these flex-circuits as shown wraps around two chip-embedded frame-boards. Each of these package assemblies includes a flex circuit 105 having a plurality of patterned connecting-traces 107. Performing an etching process on the flex circuit 105 may pattern these connecting traces. The package assembly further includes a plurality of semiconductor chips 110 mounted on the flex circuits 105 wherein the semiconductor chips having a plurality of contact terminals 115 connected to corresponding connecting traces on the flex circuit. Bonding wires 120 are employed as that shown in FIG. 1C for connecting the contact terminals 115 to the connecting traces on the flex circuit 105. The package assembly further includes a support frame-board 130 having an edge surface 135 placed along predefined folded lines 140 and 145 on the flex circuit 105. The frame-board 130 has a plurality of open spaces, i.e., bore 150, for disposing each of the semiconductor chips 110 therein. The flex circuit 105 is provided for folding onto the support frame 130 to form the chip-embedded support-frame wrapped-by-flex-circuit package 100. In a preferred embodiment, the flex circuit 105 is a laminated multiple-layered flux circuit provided with via connections for inter-connection between multiple layers of the flex circuit. Referring to FIG. 1C, the flex circuit 105 having a plurality of connecting traces on a top surface 155 and a bottom surface 160 of the flex circuit 105. The semiconductor chips 110 are mounted on the flex circuits 105 are mounted on and connected to corresponding traces on the top surface and the bottom surface of the flex circuit 105. In an alternate embodiment, the plurality of semiconductor chips 110 mounted on the flex circuits are mounted on a top surface and a bottom surface of the laminated multiple-layered flex circuit. The contact terminals on the chips are then connected to corresponding connecting traces patterned on the laminated multiple-layered flex circuit. Preferably, the chip-embedded frame-board 130 wrapped by the flex circuit 105 is a frame-board composed of heat conductive materials such as anodized copper or aluminum. As shown in FIGS. 1A to 1C, the flex circuit 105 further includes a plurality of edge contact strips 170 disposed on edges of the flex circuit 105 each connected to corresponding connecting traces.

Figure 1D:
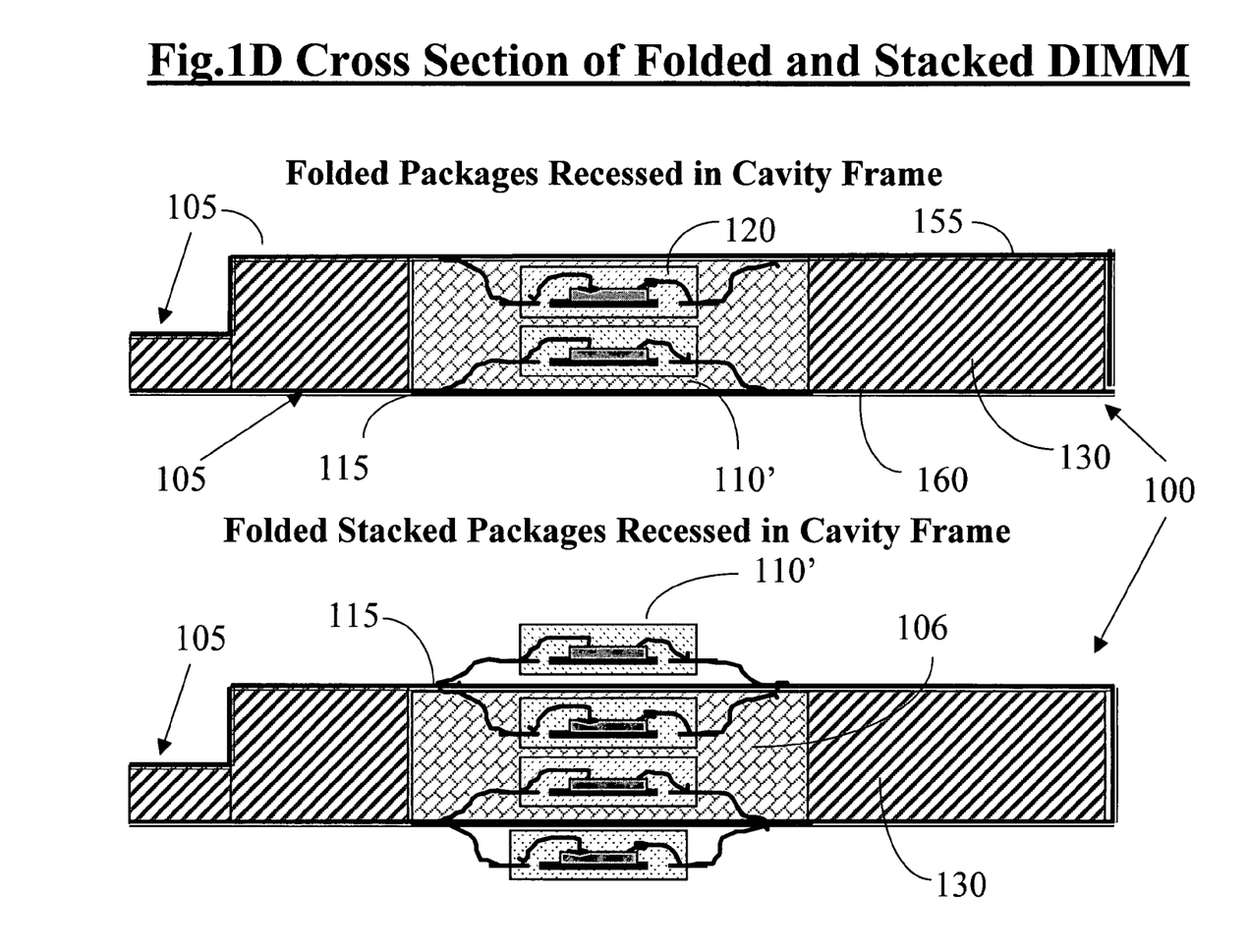
FIG. 1D is a cross sectional view of two and four stacked chips package mounted on flexible circuit and folded in DIMM format.

According to FIGS. 1B and 1C, this invention discloses a chip-embedded support-frame wrapped-by-flex-circuit package assembly 100. This package assembly includes a flex circuit 105 having a plurality of patterned connecting-traces each connected to a corresponding edge contact strips 170 disposed on edges of the flex circuit 105. The package assembly further includes a plurality of semiconductor chips 110 mounted on the flex circuits 105 wherein the semiconductor chips having a plurality of contact terminals 115 connected to corresponding connecting traces on the flex circuit. The package assembly further includes a support frame-board 130 having a plurality of open spaces 150. In this package assembly 100, the flex circuit 105 further has folding lines 140 and 145 for folding along an edge surface 135 of the support frame board 130 to warp around the support framed board 130. By folding the flex circuit 105 to wrap around the frame board 130, each of the semiconductor chips 110 are now placed in an open space 150, e.g., a hole 150 in the frame-board 130. Thus a chip-embedded support-frame 130, which is wrapped by flex-circuit 105 is formed as a package assembly achieving double or four-time packing density. Referring to FIG. 1C, the flex circuit 105 having a plurality of connecting traces on a top surface 155 and a bottom surface 160 of the flex circuit 105. The semiconductor chips 110 mounted on the flex circuits are mounted on and connected to corresponding traces on the top surface 155 and the bottom surface 160 of the flex circuit 105 to achieve four-times packing density as illustrated in FIG. 1D.

According to FIGS. 1A to 1C, a method for assembling an electronic package is also disclosed in this invention. The method includes the steps of: a) patterning a flex circuit to form a plurality of connecting traces; b)mounting a plurality of semiconductor chips onto the flex circuit and interconnecting contact terminals on the chips with corresponding connecting traces; c)placing a supporting frame-board with an edge surface aligned with predefined folding lines on the flex circuit wherein the foldable frame-board having substantially a shape and size as a folded-in-half of the flex circuit and having open spaces for disposing each of the semiconductor chips therein; and d) folding the flex circuit mounted with the semiconductor chips along the predefined folded lines wrapping the supporting framed board with the semiconductor chips disposed in the open spaces whereby a chip-embedded support-frame wrapped-by flex-circuit package is provided to multiple a packing density of the semiconductor chips. In a preferred embodiment, the step (a) of patterning a flex circuit to form a plurality of connecting traces and corresponding edge contact strips is a step of patterning a laminated multiple-layered flux circuit provided with via connections for inter-connection between multiple layers of the flex circuit. In another preferred embodiment, the method further includes a step of e) patterning a plurality of edge contact strips on edges of the flex circuit in electric contact with corresponding connecting traces. In another preferred embodiment, step (a) of patterning a flex circuit to form a plurality of connecting traces and corresponding edge contact strips is a step of patterning the flex circuit to form a plurality of connecting traces on a top surface and a bottom surface of the flex circuit. Step (b) of mounting a plurality of semiconductor chips onto the flex circuit and interconnecting contact terminals on the chips with corresponding connecting traces is a step of mounting a plurality of semiconductor chips onto the top surface and the bottom surface of the flex circuit and interconnecting contact terminals on the chips with corresponding connecting traces patterned on the top surface and the bottom surface. In another preferred embodiment, step (b) of mounting a plurality of semiconductor chips onto the flex circuit and interconnecting contact terminals on the chips with corresponding connecting traces is a step of mounting a plurality of semiconductor chips onto a top surface and a bottom surface of the laminated multiple-layered flex circuit and interconnecting contact terminals on the chips with corresponding connecting traces patterned on the laminated multiple-layered flex circuit. In another preferred embodiment, step (c) of placing a foldable frame-board with an edge surface aligned with predefined folding lines on the flex circuit is a step of placing a foldable frame composed of heat conductive materials.

Figure 2:
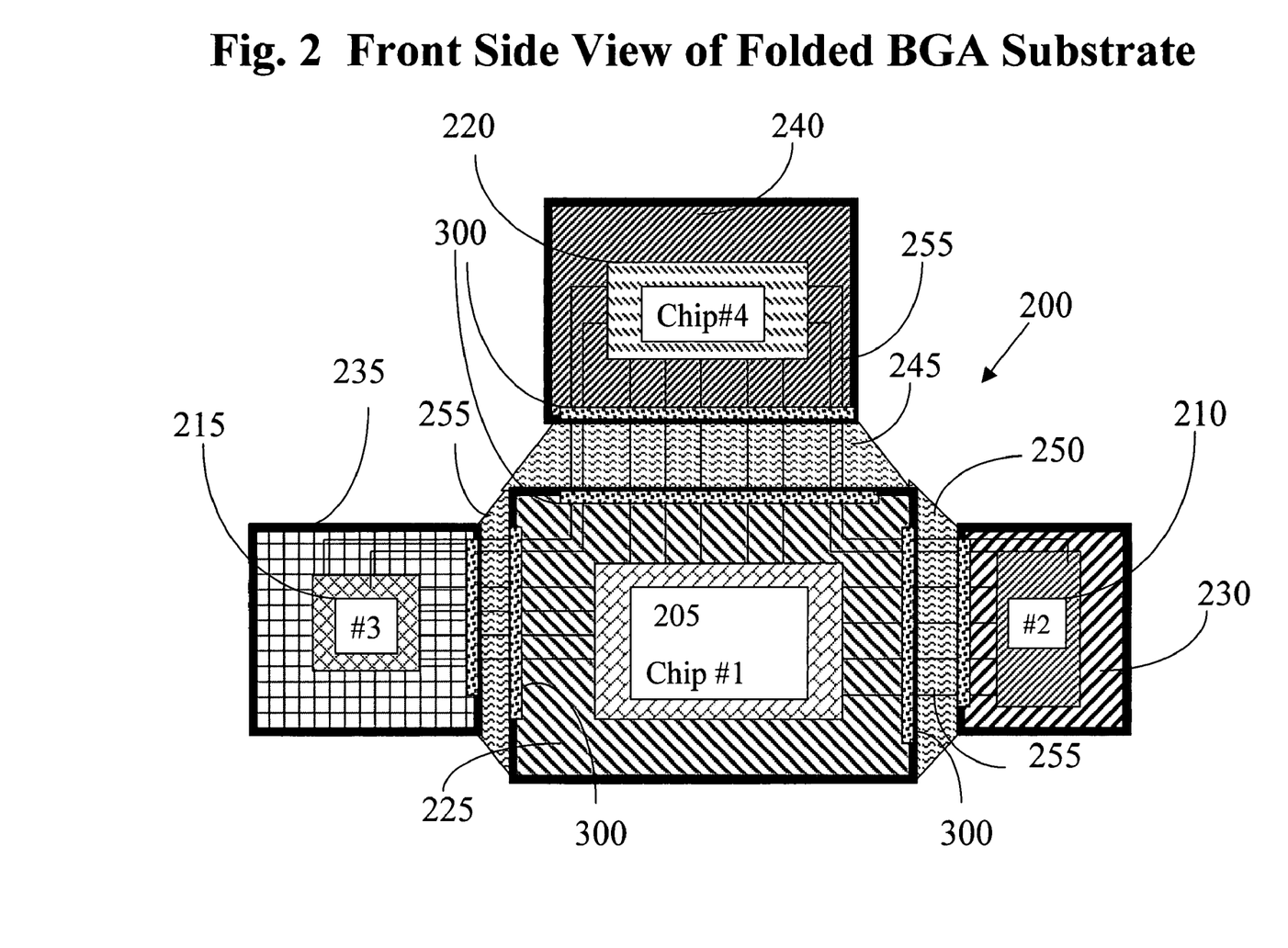
FIG. 2 is a front side view sectional view of another multiple-chip module (MCM) assembled as a folded BGA package according to the method and configuration disclosed in this invention.

Referring to FIG. 2 for another multiple-chip module (MCM) assembled as a folded BGA package according to the method and configuration disclosed in this invention. This new MCM assembly 200 includes four chips depicted as chip #1 to chip #4, i.e., enumerated as chip 205, 210, 215, and 220. The most complex chip 205, e.g., chip #1, has the highest pin count and chip 205 is placed on the center supported on a base substrate 225. As that shown in FIG. 2, each chip is supported on substrate of different materials. For example, the chip 205 is supported on a laminated PCB substrate 225, chip #2 is placed on a ceramic substrate 230. The chip #3 is placed on a glass substrate 235 and chip #4 is supported on a silicon wafer substrate 240. Each of these substrates 225 to 240 are then connected with a foldable flex-circuit 245 and 250 to the central substrate 225 supporting the base chip 205. There are conductor traces 255 joined by anisotropic conductive film (ACF) 300 connecting between the base chip 205 and each of the peripheral chips 210, 215 and 220.

Figure 3:
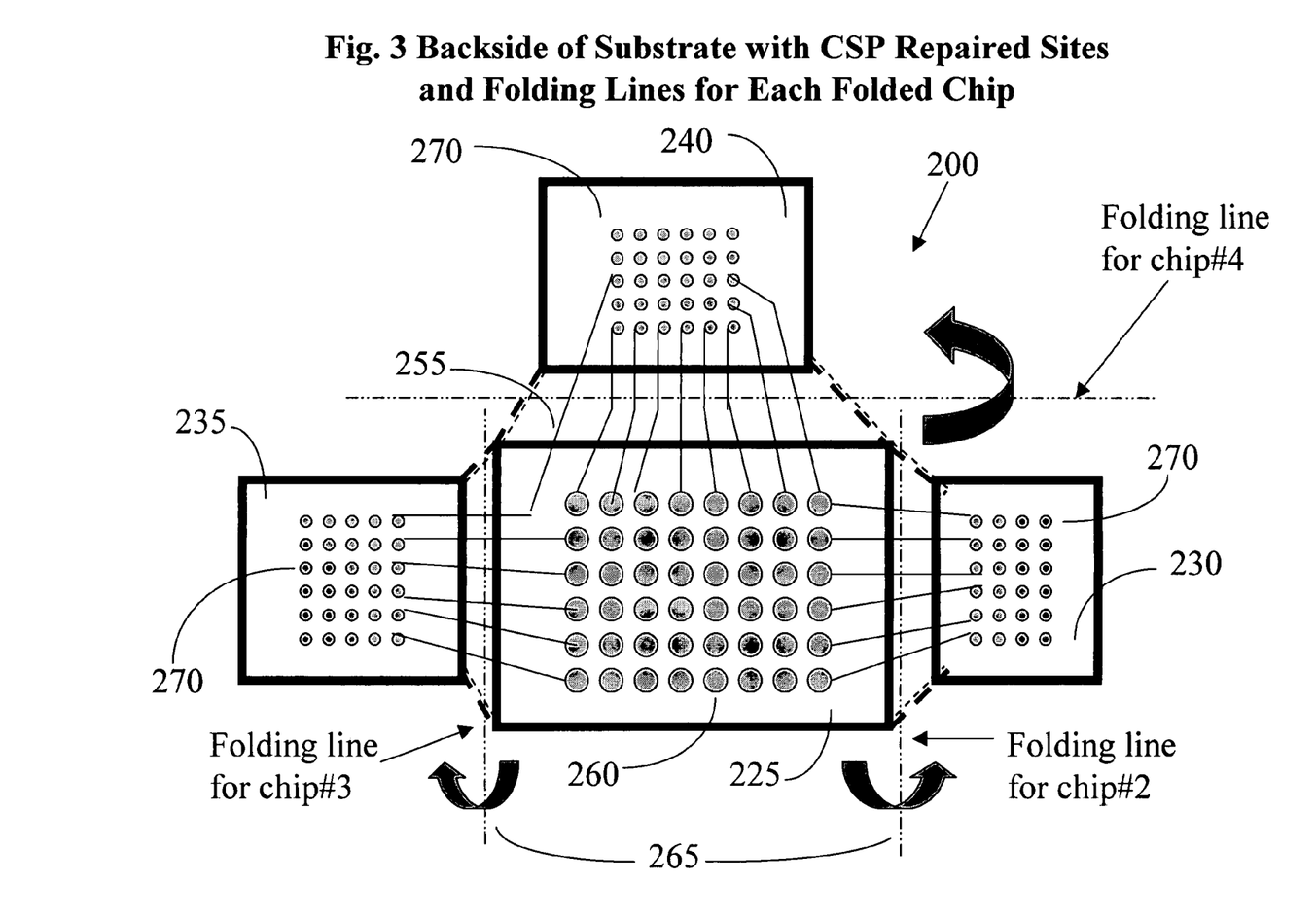
FIG. 3 is a backside view of the MCM assembly of FIG. 2.

Referring to FIG. 3 for the backside of the MCM assembly 200. A ball grid array that includes a plurality of solder balls 260 are disposed on the backside of the substrate 225 that supports the chip 205 with the highest pin count. For the purpose of providing more flexibility of repairing the peripheral chips 210, 215, and 220, there are chip-size-package (CSP) repair sites distributed as micro-balls 270 on the backside of the substrates 230, 235, and 240. These CSP repair sites with the micro-balls 270 have the footprints corresponding to the packaged chips 210, 215, and 220. Once a peripheral chip is found defective or malfunction, a repair process of the defective peripheral chip is carried out by simply mounting a known-good packaged chip onto the CSP repair sites that has exact matching footprints to receive and connect the repairing packaged IC chip.

On the other hand, if the base chip 205 that has the highest pin count is damaged or cannot be easily repaired, the each of these peripheral chips 210, 215 and 220 can be singulated through a cutting or folding line 265. Cost savings are achieved because the peripheral chips can be separated and individually used. Wastes are prevented in a situation when the most expensive chip 205 with highest pin count is damaged or has a malfunction in the operation.

Figure 4:
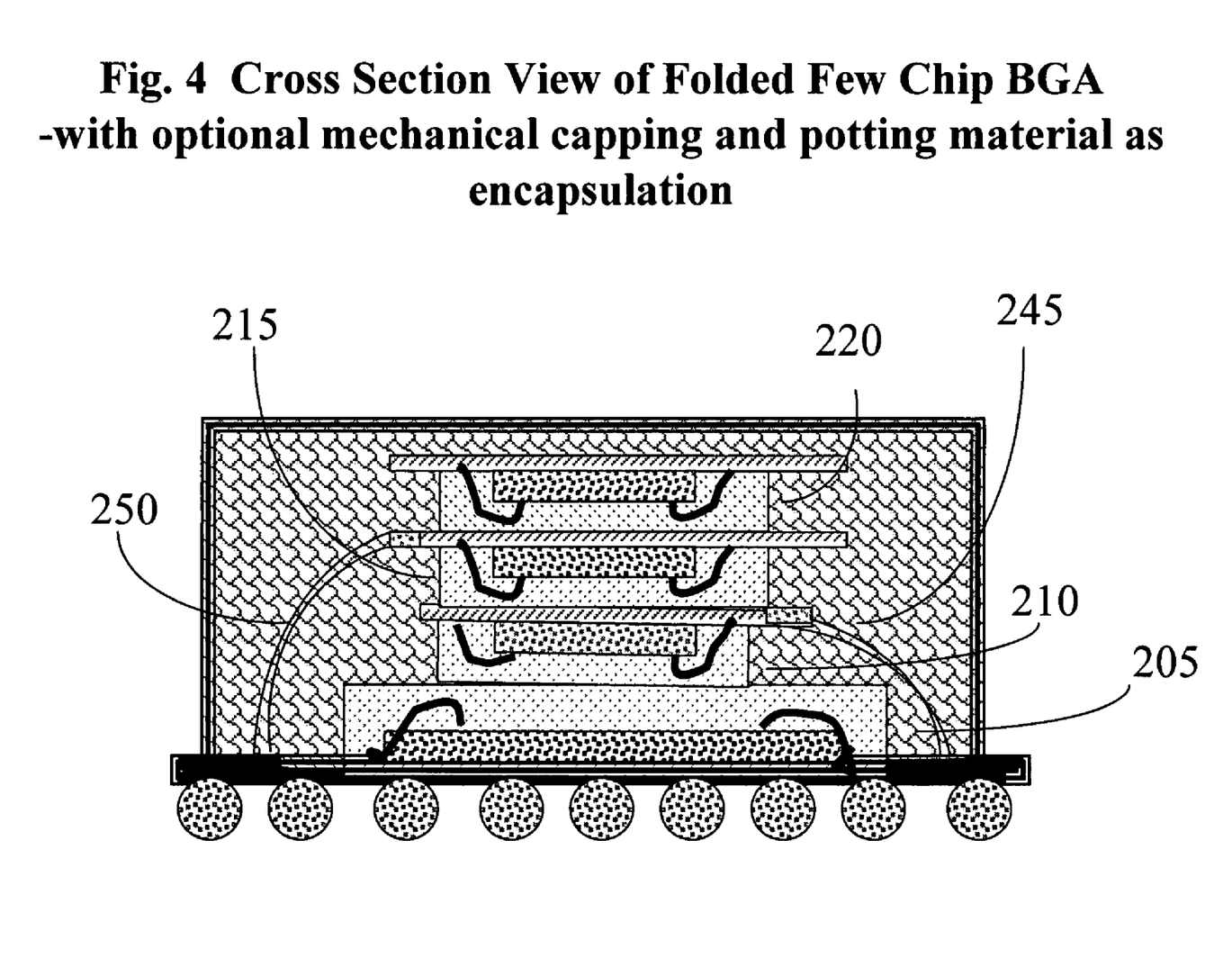
FIG. 4 is a side cross sectional view of a folded MCM package with these four packaged chips as that shown in FIG. 2 stacked up in a vertical direction.

Referring to FIG. 4 for a folded MCM package with these four packaged chips 205, 210, 215, and 220 stacked up in a vertical direction. After these four chips are tested and repaired if necessary, a folding process can be carried out. The folding process is similar to a folding process of constructing a box. In order to vertically fold and stack these packaged chip as shown, the length of the flex-circuit 245 and 250 are arranged such that the length of the foldable flex-circuit 250 is slightly longer than the length of the flex-circuit 245 such that the chip 215 can be stacked above the chip 210 according to the order of the folding operations. In the meantime, the electrical connections and signal transmissions between these vertically stacked chips are carried out by the interconnected ACF conductive traces 255. After the packaged are folded, the entire package is capped or encapsulated into a single ball grid array (BGA) package with a compact size with reduced footprint.

Figure 5:
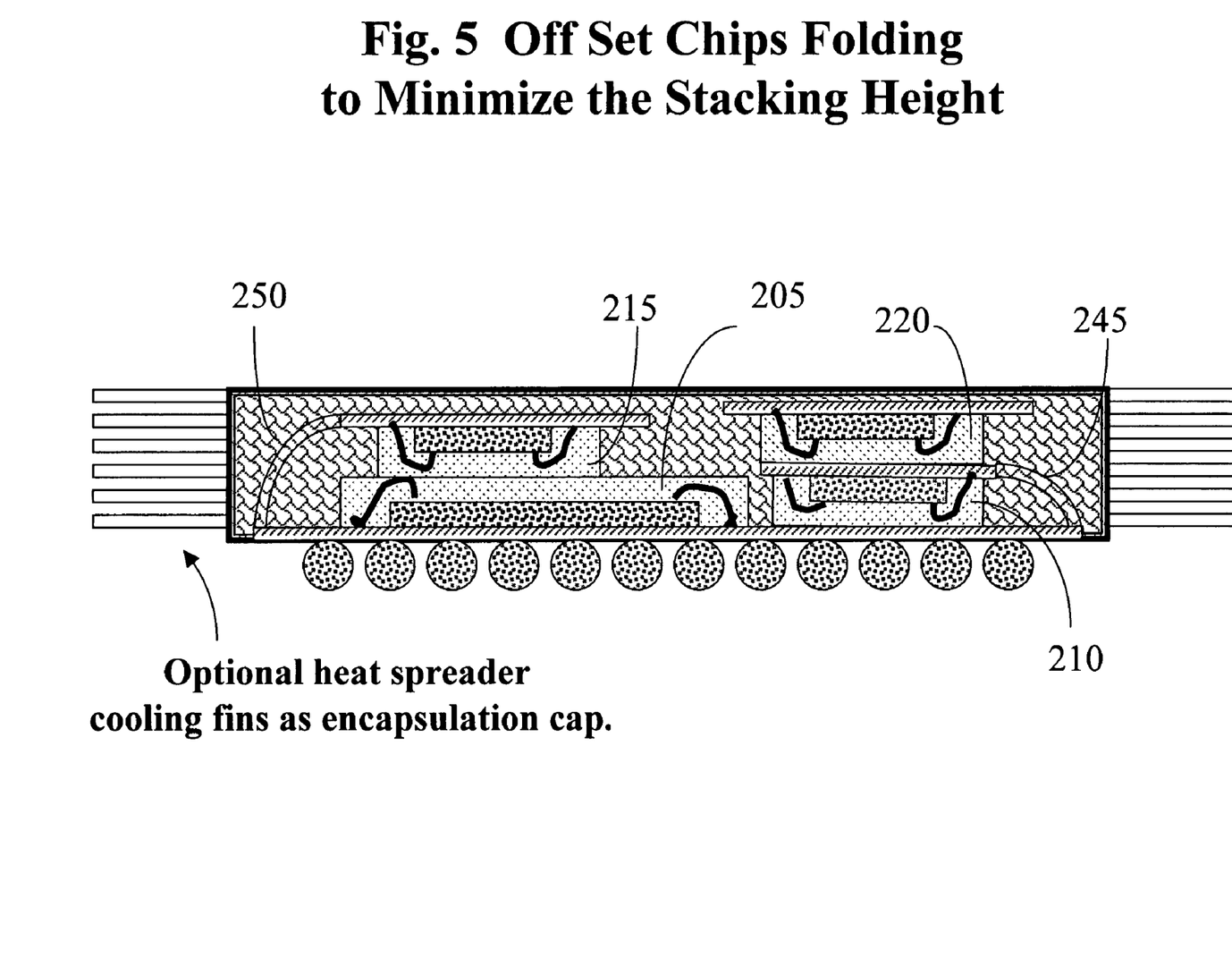
FIG. 5 is a side cross sectional view of an alternate folded MCM package with four packaged chips as that shown in FIG. 2 stacked up in a vertical direction with less height.

If a more stringent form requirement is imposed with a reduce height of the MCM package, then an alternate configuration can be implemented as that shown in FIG. 5. The chip 210 is folded to be on a same vertical level as the major chip 205. The chips 215 and 200 are stacked on top of the chip 205 and 210 respectively thus making this MCM package a "two story" structure instead of a "four story" structure as that shown in FIG. 4.

According to FIGS. 2 to 5, this inventions discloses a multiple-chip-module (MCM) assembly that includes at least two integrate circuit (IC) chips mounted on and packaged on two separate substrates. The MCM assembly further includes a foldable flex-circuit attached to the separate substrates for folding the IC chips on a vertically stacked configuration wherein at least on of the substrates having a chip-size-package (CSP) repair-site footprint disposed on a backside of the substrate ready for mounting a replacement IC chip for replacing the IC chip when required. In a preferred embodiment, the conductive traces conductive traces disposed on the foldable flex-circuit interconnecting the IC chips. In another preferred embodiment, at least two IC chips mounted on and packaged on at least two different substrates. In another preferred embodiment, at least one of the IC chips mounted on and packaged on the substrate as a ball-grid-array (BGA) package. In another preferred embodiment, at least one of the IC chips having a highest pin counts among the IC chips and mounted on and packaged on a main substrate as a ball-grid-array (BGA) package. In another preferred embodiment, the flex-circuit further includes a cutoff line for cutting off and separating at least one of the packaged IC chips as a re-useable single IC chip if necessary.

Although the present invention has been described in terms of the presently preferred embodiment, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

I claim:

1. A chip-embedded support-frame wrapped-by-flex-circuit package assembly comprising:
   a flex circuit having a plurality of patterned connecting-traces on a top surface and a bottom surface of said flex circuit
   a plurality of semiconductor chips mounted on said flex circuits wherein said semiconductor chips having a plurality of contact terminals connected to corresponding connecting traces on said flex circuit;
   a support frame having an edge surface placed along predefined folded lines on said flex circuit having a plurality of open spaces for disposing each of said semiconductor chips therein, wherein said flex circuit is provided for folding onto said support frame to form said chip-embedded support-frame wrapped-by-flex-circuit package;
   said plurality of semiconductor chips mounted on said flex circuits are mounted on and connected to corresponding traces on said top surface and said bottom surface of said flex circuit.

2. The package assembly of claim 1 wherein:
   said flexible circuit is a laminated multiple-layered flexible circuit provided with via connections for inter-connection between multiple layers of said flexible circuit.

3. A chip-embedded support-frame wrapped-by-flex-circuit package assembly comprising:
   a flex circuit having a plurality of patterned connecting-traces;
   a plurality of semiconductor chips mounted on said flex circuits wherein said semiconductor chips having a plurality of contact terminals connected to corresponding connecting traces on said flex circuit;
   a support frame having an edge surface placed along predefined folded lines on said flex circuit having a plurality of open spaces for disposing each of said semiconductor chips therein, wherein said flex circuit is provided for folding onto said support frame to form said chip-embedded support-frame wrapped-by-flex-circuit package; and
   said plurality of semiconductor chips mounted on said flex circuits are mounted on a top surface and a bottom surface of said laminated multiple-layered flex circuit and having contact terminals on said chips connected to corresponding connecting traces patterned on said laminated multiple-layered flex circuit.

4. The package assembly of claim 1 wherein:
   said chip-embedded frame-board wrapped by said flex circuit is a frame-board composed of heat conductive materials.

5. The package assembly of claim 1 wherein:
   said flex circuit further includes a plurality of edge contact strips disposed on edges of said flex circuit each connected to corresponding connecting traces.

6. A chip-embedded support-frame wrapped-by-flex-circuit package assembly comprising:
   a flex circuit having a plurality of patterned connecting-traces each connected to a corresponding edge contact strips disposed on edges of said flex circuit;
   a plurality of semiconductor chips mounted on said flex circuits wherein said semiconductor chips having a plurality of contact terminals connected to corresponding connecting traces on said flex circuit;
   a support frame-board having a plurality of open spaces;
   said flex circuit further having folding lines for folding along an edge surface of said support frame board to warp around said support framed board for disposing each of said semiconductor chips in an open space on said support frame-board thus constituting said chip-embedded support-frame wrapped-by-flex-circuit package;
   said flex circuit having a plurality of connecting traces on a top surface and a bottom surface of said flex circuit; and
   said plurality of semiconductor chips mounted on said flex circuits are mounted on and connected to corresponding traces on said top surface and said bottom surface of said flex circuit.

* * * * *